US006756325B2

(12) United States Patent
Bour et al.

(10) Patent No.: US 6,756,325 B2
(45) Date of Patent: Jun. 29, 2004

(54) METHOD FOR PRODUCING A LONG WAVELENGTH INDIUM GALLIUM ARSENIDE NITRIDE (INGAASN) ACTIVE REGION

(75) Inventors: David P. Bour, Cupertino, CA (US); Tetsuya Takeuchi, Sunnyvale, CA (US); Ashish Tandon, Sunnyvale, CA (US); Ying-Lan Chang, Cupertino, CA (US); Michael R. T. Tan, Menlo Park, CA (US); Scott Corzine, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 158 days.

(21) Appl. No.: 10/140,625

(22) Filed: May 7, 2002

(65) Prior Publication Data

US 2003/0211647 A1 Nov. 13, 2003

(51) Int. Cl.[7] .............................................. H01L 21/00
(52) U.S. Cl. ......................... 438/962; 438/46; 438/47; 438/57; 438/73; 438/93; 438/94; 438/478; 438/503; 438/506; 438/936; 438/938; 438/956
(58) Field of Search .............................. 438/46, 47, 57, 438/73, 93, 94, 478, 503, 506, 936, 938, 956, 962

(56) References Cited

U.S. PATENT DOCUMENTS

| | | | | |
|---|---|---|---|---|
| 5,944,913 A | * | 8/1999 | Hou et al. | 136/255 |
| 6,198,112 B1 | * | 3/2001 | Ishida et al. | 257/15 |
| 6,207,973 B1 | * | 3/2001 | Sato et al. | 257/98 |
| 6,382,800 B2 | * | 5/2002 | Sato | 257/103 |

OTHER PUBLICATIONS

Article entitled "Effect of hydrogen on the indium incorporation in InGaN epitaxial films" by Piner, et al.. Appl. Phys. Lett (70) dated Jan. 27, 1997; 1997 American Institute of Physics, pp. 461–463.
Article entitled "GaInNAs: A Novel Material for Long–Wavelength Semiconductor Lasers" by Kondow, et al., IEEE Journal of Selected Topics in Quantum Electronics, vol. 3, No. 3, Jun. 1997, pp. 719–730.
Article entitled "1.3–μm Continuous–Wave Lasing Operating in GaINNAs Quantum–Well Lasers" by Nakahara, et al., IEEE Photonics Technology Letters, vol. 10, No. 4, Apr. 1998, pp. 487–488.
Article entitled "Gas–source MBE of GaInNAs for long–wavelength laser diodes" by Kondow, et al., Journal of Crystal Growth 188 (1988) pp. 255–259.

(List continued on next page.)

Primary Examiner—Kamand Cuneo
Assistant Examiner—Lisa Kilday

(57) ABSTRACT

Several methods for producing an active region for a long wavelength light emitting device are disclosed. In one embodiment, the method comprises placing a substrate in an organometallic vapor phase epitaxy (OMVPE) reactor, the substrate for supporting growth of an indium gallium arsenide nitride (InGaAsN) film, supplying to the reactor a group-III–V precursor mixture comprising arsine, dimethylhydrazine, alkyl-gallium, alkyl-indium and a carrier gas, where the arsine and the dimethylhydrazine are the group-V precursor materials and where the percentage of dimethylhydrazine substantially exceeds the percentage of arsine, and pressurizing the reactor to a pressure at which a concentration of nitrogen commensurate with light emission at a wavelength longer than 1.2 um is extracted from the dimethylhydrazine and deposited on the substrate.

12 Claims, 7 Drawing Sheets

OTHER PUBLICATIONS

Article entitled "GaNAs/GaInAs short–period superlattice quantum well structures grown by MOCVD using TBAs and DMHy" by Miyamoto, et al., Journal of Crystal Growth 195 (1998) pp. 421–426.

Article entitled "Nonlinear dependence of N incorporation on In content in GaInNAs" by Friedman, et al., Journal of Crystal Growth 195 (1988) pp. 438–443.

Article entitled "High–Quality InGaAsN Growth by Metalorganic Vapor–Phase Epitaxy Using Nitrogen Carrier Gas and Dimethylhydrazine, Tertiarybutylarsine as Group V Prescursors" by Ougazzaden, et al., Jpn. J. Appl. Phys., vol. 38 (1999), pp. 1019–1021.

Article entitled "Room–Temperature Continuous–Wave Operation of 1.24–$\mu$m GaInNAs Lasers Grown by Metal–Organic Chemical Vapor Deposition" by Sato and Satoh, IEEE Journal of Selected Topics in Quantum Electronics, vol. 5, No. 3, May/Jun. 1999.

Article entitled, "A 1.13–$\mu$m GaInNAs Laser Diode with a Lifetime of over 1000 Hours" by Kondow, et al., Jpn. J. Appl. Phys. vol. 38 (1999), pp. L1355–L1356.

Article entitled "A 1.3–$\mu$m GaInNAs/GaAs Single–Quantum–Well Laser Diode with a High Characteristic Temperature over 200 K", by Kitatani, et al., Jpn. J. Appl. Phys. vol. 39 (2000) pp. L86–L87.

Article entitled "Low Threshold and High Characteristic Temperature 1.3–$\mu$m Range GaInNAs Lasers grown by Metalorganic Chemical Vapor Deposition" by Sato, Jpn. J. Appl. Phys. vol. 39 (2000) pp. 3403–3405.

Article entitled "Thermodynamic analysis of III–V semiconductor alloys grown y metalorganic vapor phase epitaxy" by Asai and Dandy, Journal of Applied Physics, vol. 88, No. 7, Oct. 1, 2000, pp. 4407–4416.

* cited by examiner

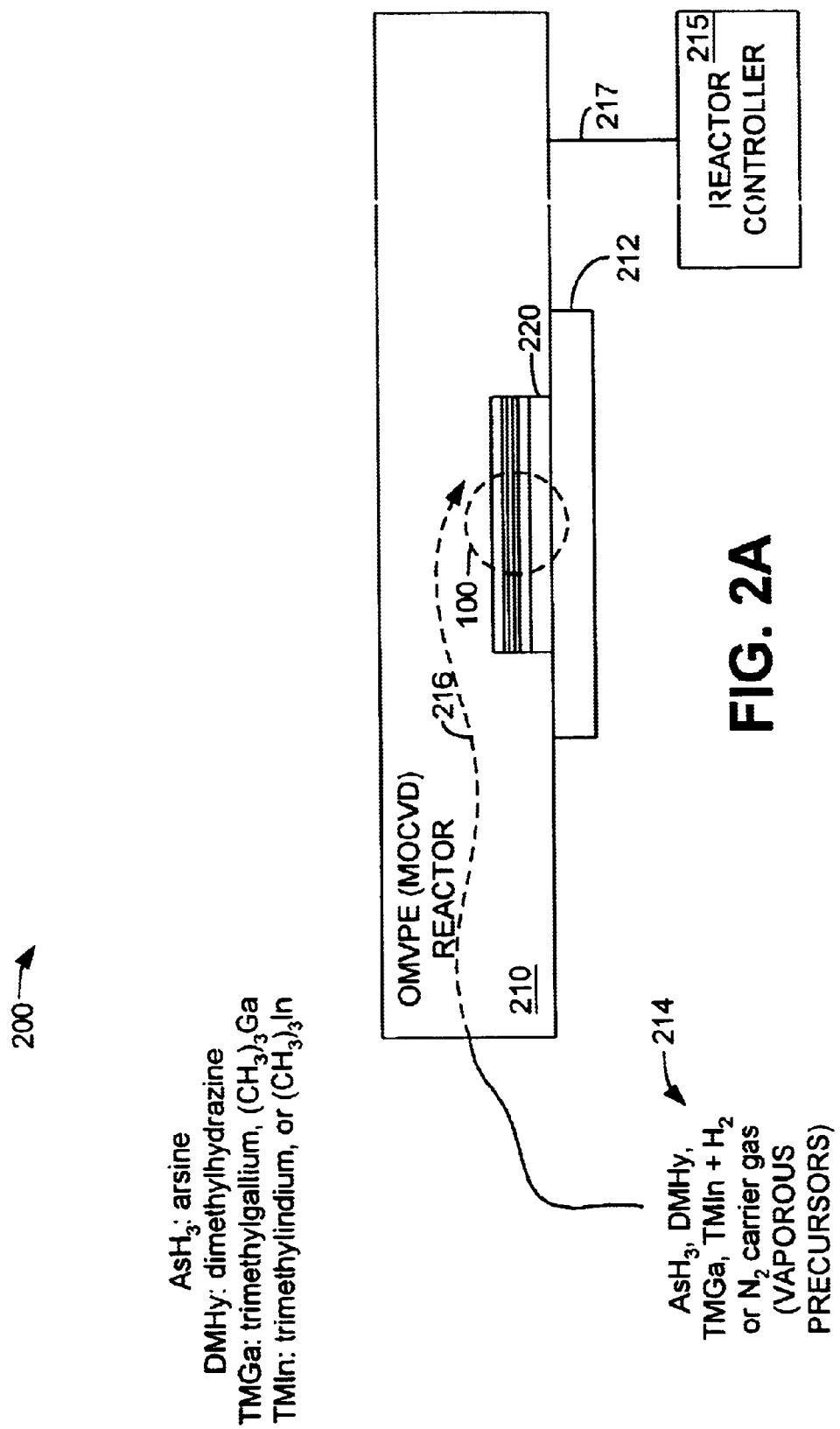

METHOD FOR PRODUCING A LONG WAVELENGTH INDIUM GALLIUM ARSENIDE NITRIDE (INGAASN) ACTIVE REGION

TECHNICAL FIELD

The invention relates generally to light emitting devices, and, more particularly, to a method for producing an InGaAsN active region for a long wavelength light emitting device.

BACKGROUND OF THE INVENTION

Light emitting devices are used in many applications including optical communication systems. Optical communication systems have been in existence for some time and continue to increase in use due to the large amount of bandwidth available for transporting signals. Optical communication systems provide high bandwidth and superior speed and are suitable for efficiently communicating large amounts of voice and data over long distances. Optical communication systems that operate at relatively long wavelengths on the order of 1.3 micrometers ($\mu$m) to 1.55 $\mu$m are generally preferred because optical fibers generally have their lowest attenuation in this wavelength range. These long wavelength optical communication systems include a light source capable of emitting light at a relatively long wavelength. Such a light source is a vertical-cavity surface-emitting laser (VCSEL), although other types of light sources are also available.

The alloy indium gallium arsenide nitride (InGaAsN) is useful to form the active-region for a VCSEL operating at the long wavelengths preferred for optical fiber communication. This material allows the operating wavelength of a conventional aluminum gallium arsenide (AlGaAs) VCSEL to be extended to approximately 1.3 $\mu$m. Furthermore, in other applications using photonic devices, such as light emitting diodes (LEDs), edge-emitting lasers, and vertical-cavity surface-emitting lasers (VCSELs), excellent performance characteristics are expected for InGaAsN active regions as a consequence of the strong electron confinement offered by AlGaAs heterostructures, which, provide carrier and optical confinement in both edge-emitting and surface-emitting devices. InGaAsN active regions benefit both edge- and surface-emitting lasers and may lead to InGaAsN becoming a viable substitute for indium gallium arsenide phosphide (InGaAsP) in 1.3 $\mu$m lasers.

Forming an InGaAsN active region is possible using a technique known as molecular beam epitaxy (MBE). MBE uses a nitrogen radical, generated by a plasma source, as a source of active nitrogen species. The purity of the nitrogen is typically high because high purity nitrogen gas is widely available. Further, using MBE, the incorporation efficiency of nitrogen into the epitaxial layer approaches unity. Unfortunately, MBE provides a low growth rate, resulting in a long growth time, and does not scale well, and therefore does not lend itself to high volume production of light emitting devices.

Another technique for producing semi-conductor based light emitting devices is known as organometallic vapor phase epitaxy (OMVPE), sometimes referred to as metal organic chemical vapor deposition (MOCVD). OMVPE uses liquid chemical precursors, through which a carrier gas is passed, to generate a chemical vapor that is passed over a heated semiconductor substrate located in a reactor. Conditions in the reactor are controlled so that the combination of vapors forms an epitaxial film as the vapors pass over the substrate.

Unfortunately, growing high quality InGaAsN using OMVPE is difficult because the purity of the nitrogen precursor (typically dimethylhydrazine (DMHy), $[CH_3]_2NNH_2$) is difficult to control, and the components that form the InGaAsN alloy are somewhat immiscible. This results in a non-homogeneous mixture where the nitrogen may not be uniformly distributed throughout the layer. Instead, the nitrogen tends to "clump." The alloy composition fluctuations translate into bandgap fluctuations. This causes broadening of the spontaneous emission spectrum and the gain spectrum, which raises laser threshold current.

Furthermore, it is difficult to extract atomic nitrogen from the DMHy molecule, thereby making it difficult to incorporate a sufficient quantity of nitrogen in the InGaAsN film. The ratio of DMHy to arsine ($AsH_3$, the arsenic precursor) must be increased because the arsenic provided by the arsine competes with the nitrogen for the group-V lattice sites. Unfortunately, reducing the proportion of arsine tends to reduce the optical quality of the InGaAsN film.

To incorporate a sufficient quantity of nitrogen in the epitaxial film, extremely high dimethylhydrazine ratios (DMHy:V, where "V" represents the total group-V precursor flow rate, comprising DMHy+$AsH_3$) are used during OMVPE growth of InGaAsN. However, even when the DMHy ratio is raised to 90% or greater, the nitrogen component in the film may be negligible (<<1%), despite the very high nitrogen content in the vapor. Moreover, the nitrogen content drops even further in the presence of indium, which is a necessary component for a 1.3 $\mu$m laser diode quantum well layer. Ideally, for 1.3 $\mu$m light emitting devices, the indium content should be about, or greater than, 30%, and the nitrogen content about 0–2%. Without nitrogen, a 1.2 $\mu$m wavelength is the longest likely attainable wavelength from a high indium content quantum well (where the maximum indium content is limited by the biaxial compression). The addition of even a very slight amount of nitrogen (0.3%<[N]<2%) leads to a large drop in the bandgap energy that enables the wavelength range to be extended to 1.3 $\mu$m and beyond. Nevertheless, it is still difficult to achieve a nitrogen content of [N]~1%, even when the nitrogen content of the vapor exceeds 90%.

Therefore, it would be desirable to economically mass produce a high optical quality light emitting device having an InGaAsN active layer using OMVPE.

SUMMARY OF THE INVENTION

Embodiments of the invention provide several methods for using OMVPE to grow high quality light emitting active regions. In one embodiment, the method comprises placing a substrate in an organometallic vapor phase epitaxy (OMVPE) reactor, the substrate for supporting growth of an indium gallium arsenide nitride (InGaAsN) film, supplying to the reactor a group-III–V precursor mixture comprising arsine, dimethylhydrazine, alkyl-gallium, alkyl-indium and a carrier gas, where the arsine and the dimethylhydrazine are the group-V precursor materials and where the percentage of dimethylhydrazine substantially exceeds the percentage of arsine, and pressurizing the reactor to a pressure at which a concentration of nitrogen commensurate with light emission at a wavelength longer than 1.2 um is extracted from the dimethylhydrazine and deposited on the substrate.

In an alternative embodiment, the method comprises placing a substrate in an organometallic vapor phase epitaxy (OMVPE) reactor, the substrate for supporting growth of an indium gallium arsenide nitride (InGaAsN) film, supplying to the reactor a group-III–V precursor mixture comprising arsine, alkyl-gallium, alkyl-indium and a carrier gas, where the arsine is the group-V precursor material, growing a sublayer of $In_xGaAs_{1-x}$, where x is equal to or greater than 0, discontinuing the group-III precursor mixture, and supplying to the reactor a group-V precursor mixture comprising arsine and dimethylhydrazine where the percentage of dimethylhydrazine substantially exceeds the percentage of arsine.

In another alternative embodiment, the method comprises providing a substrate in an organometallic vapor phase epitaxy (OMVPE) reactor, supplying to the reactor a group-III–V precursor mixture, where the group-III precursor mixture includes alkyl-gallium and alkyl-indium, and the group-V precursor mixture comprises arsine and dimethylhydrazine, and growing a layer of indium gallium arsenide nitride commensurate with light emission at a wavelength longer than 1.2 um over the substrate by minimizing the amount of arsine and maximizing the amount of dimethylhydrazine.

Other features and advantages in addition to or in lieu of the foregoing are provided by certain embodiments of the invention, as is apparent from the description below with reference to the following drawings.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the present invention.

FIG. 2A is a schematic diagram illustrating an OMVPE reactor constructed in accordance with an aspect of the invention.

DETAILED DESCRIPTION OF THE INVENTION

While described below using a vertical-cavity surface-emitting laser (VCSEL) that incorporates InGaAsN epitaxial layers, other device structures can benefit from the invention. For example, an edge-emitting laser including a high quality InGaAsN epitaxial layer can be economically fabricated using the concepts of the invention.

Figure 1A:
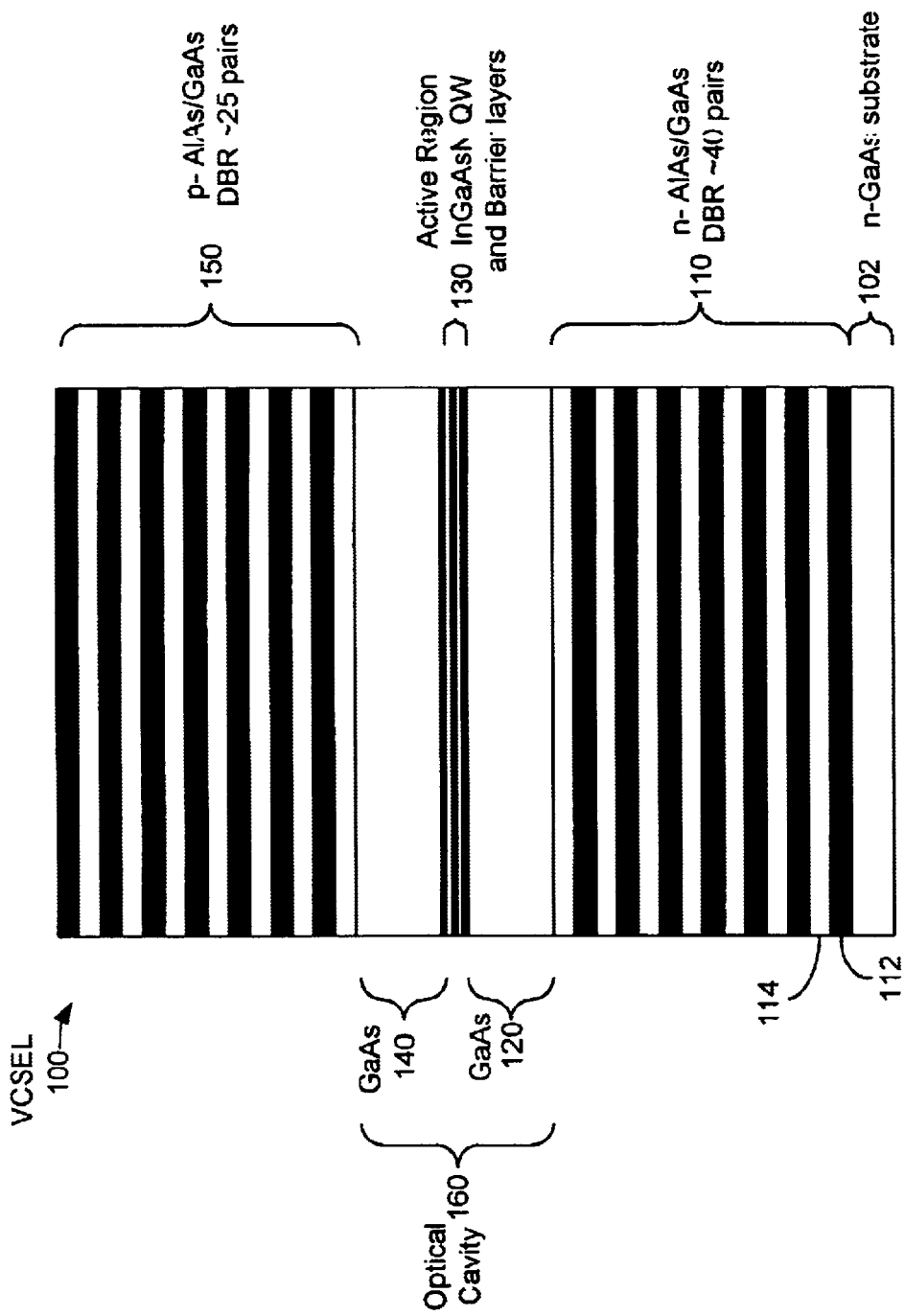
FIG. 1A is a schematic view illustrating an exemplary vertical-cavity surface-emitting laser (VCSEL) constructed in accordance with an aspect of the invention.

FIG. 1A is a schematic view illustrating an exemplary vertical-cavity surface-emitting laser (VCSEL) 100 constructed in accordance with an aspect of the invention. The VCSEL 100 comprises an N-type gallium arsenide (GaAs) substrate 102 over which an N-type distributed Bragg reflector (DBR) 110 is formed. In this example, the DBR 110 includes approximately 40 alternating pairs of aluminum arsenide (AlAs) and gallium arsenide (GaAs) epitaxial layers, exemplary ones of which are illustrated using reference numerals 112 and 114, respectively. As known to those having ordinary skill in the art, the reflectivity of the DBR 110 is determined by the index of refraction difference between the two materials that comprise the alternating layers of the DBR and the number of layers used to construct the DBR. These parameters, as well as others, can be varied to fabricate a DBR having specific properties.

A gallium arsenide (GaAs) lower cavity spacer layer 120 is formed over the DBR 110. In a VCSEL, a pair of cavity spacer layers sandwich the active region and are sometimes referred to as optical cavity spacer layers, or cavity spacer layers. The thickness of the cavity spacer layers is adjusted to optimize the optical mode and quantum well gain of the VCSEL, thereby providing the proper Fabry-Perot resonance, as known to those having ordinary skill in the art. An analogous structure is the separate confinement heterostructure (SCH) layers that sandwich the active region in an edge-emitting device.

In accordance with an aspect of the invention, an active region 130 comprising alternating layers of indium gallium arsenide nitride (InGaAsN) quantum well layers and GaAs barrier layers is then formed over the GaAs lower cavity spacer layer 120. A GaAs upper cavity spacer layer 140 is formed over the active region 130 and a p-type DBR 150 comprising approximately 25 alternating pairs of AlAs and GaAs epitaxial layers is formed over the GaAs upper cavity spacer layer 140. An InGaAsN quantum well layer and the surrounding GaAs barrier layers form a quantum well. In the example shown in FIG. 1A, the GaAs lower cavity spacer layer 120 forms the barrier layer for the lowermost InGaAsN quantum well layer in the active region 130. Similarly, the GaAs upper cavity spacer layer 140 forms the barrier layer for the uppermost InGaAsN quantum well layer in the active region 130.

The GaAs lower cavity spacer layer 120, the GaAs upper cavity spacer layer 140, and the active region 130 form an optical cavity 160 in which light generated by the active region 130 and reflected between the DBRs 110 and 150 passes until emitted through one of the DBRs. Depending on the direction of the desired light emission, one of the DBRs will have a reflectivity slightly less than the other DBR. In this manner, light will be emitted from the VCSEL through the reflector having the slightly less reflectivity. In accordance with an embodiment of the invention, InGaAsN quantum well layers that are formed as part of the active region 130 are grown in an OMVPE reactor at an elevated pressure, as will be described below with particular reference to FIG. 2.

In an alternative embodiment of the invention, high quality InGaAsN quantum well layers are grown using a growth stop procedure in which epitaxial growth is stopped during the introduction of nitrogen. This "growth stop" procedure will be described in greater detail with respect to FIGS. 5A through 5F.

Figure 1B:
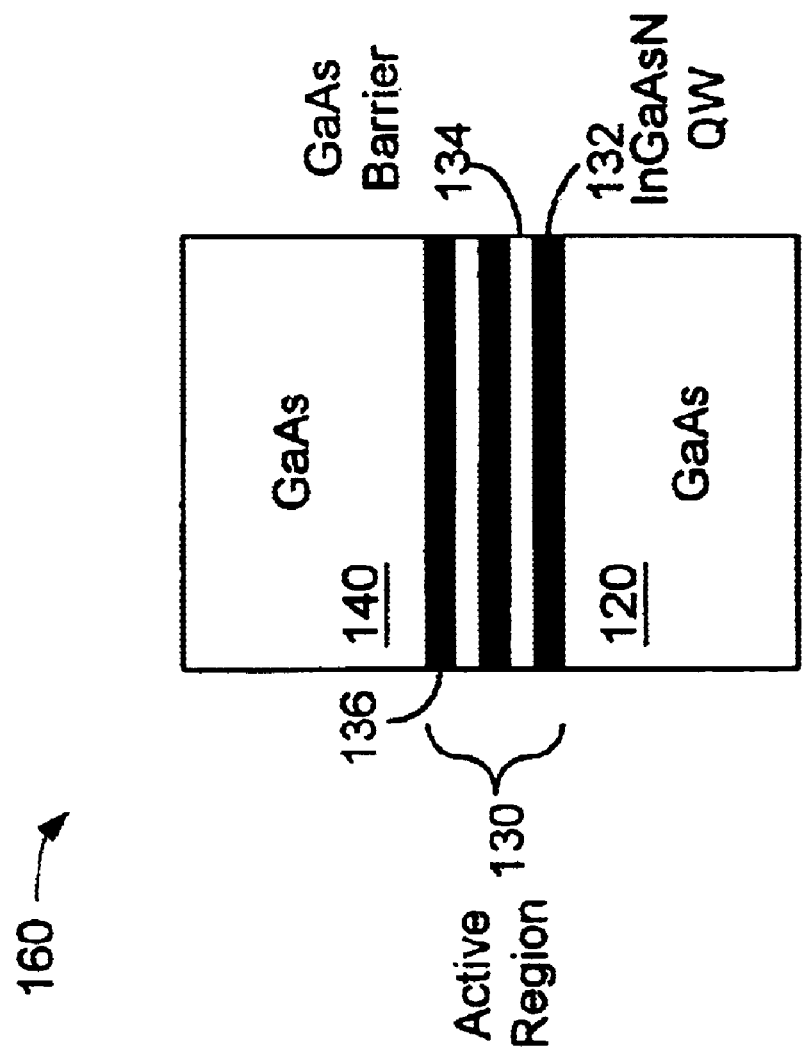
FIG. 1B is a schematic view illustrating the optical cavity of the VCSEL of FIG. 1A.

FIG. 1B is a schematic view illustrating the optical cavity 160 of the VCSEL 100 of FIG. 1A. As shown in FIG. 1B, the active region 130 that includes a first InGaAsN quantum well layer 132 fabricated over the GaAs lower cavity spacer layer 120. A GaAs barrier layer 134 is fabricated over the first InGaAsN quantum well layer 132. The combination of an InGaAsN quantum well layer and the surrounding GaAs barrier layer 134 and GaAs lower cavity spacer layer 120 forms a quantum well. Alternating quantum well layers and barrier layers are deposited until the desired number of quantum wells is formed. Finally, the GaAs upper cavity spacer layer 140 is fabricated over the last InGaAsN quantum well layer, thus completing the optical cavity 160.

FIG. 2A is a schematic diagram 200 illustrating an OMVPE reactor 210 constructed in accordance with an embodiment of the invention. Many of the details of an OMVPE reactor are omitted for clarity, as they are known to those having ordinary skill in the art. A reactor controller 215 is coupled to the reactor 210 via connection 217. The reactor controller can control various operating aspects and parameters of the reactor 210. As will be described in greater detail below, the reactor controller 215 can be used to control, among other parameters, the pressure in the reactor 210 during epitaxial growth.

To facilitate OMVPE epitaxial growth, a carrier gas is bubbled through the constituent precursor compounds so that a saturated vaporous precursor is created for each compound. After the carrier gas is bubbled through the constituent precursor compounds, the saturated vaporous precursors are then diluted with other gasses as known to those having ordinary skill in the art. The vaporous precursors are transported into the reactor by the carrier gas. The vaporous precursors are pyrolized inside the reactor and passed over a heated substrate wafer, yielding the constituent atomic elements. These elements are deposited on the heated substrate wafer, where they bond to the underlying crystal structure of the substrate wafer, thereby forming an epitaxial layer.

In the example shown in FIG. 2A, and to facilitate the growth of an InGaAsN quantum well layer, the vaporous precursors 214 may include arsine ($AsH_3$), the arsenic precursor, dimethylhydrazine (DMHy), the nitrogen precursor, trimethylgallium (TMGa), the gallium precursor, trimethylindium (TMIn), the indium precursor, and a carrier gas. Trimethylgallium is also known to those having ordinary skill in the art as alkyl-gallium, which has the chemical formula $(CH_3)_3Ga$, and trimethylindium is also known to those having ordinary skill in the art as alkyl-indium, which has the chemical formula $(CH_3)_3In$.

Other vaporous precursors can also be used depending on the desired composition of the epitaxial layers. The carrier gas can be, for example, hydrogen ($H_2$) or nitrogen ($N_2$). The carrier gas is bubbled through these chemical precursors. These flows are subsequently combined into a vaporous mixture of the appropriate concentrations, and carried into the OMVPE reactor 210.

To achieve optimum layer thickness, composition uniformity and interface abruptness, additional carrier gas may be introduced to increase the flow velocity. A heated susceptor 212 comprises a heated surface (typically graphite, silicon carbide, or molybdenum) on which a crystalline substrate 220 resides. The DBR 110, lower cavity spacer layer 120, active region 130, upper cavity spacer layer 140 and the DBR 150 are grown over the crystalline substrate 220 and form the VCSEL 100 (FIG. 1A). In this example, the InGaAsN quantum well layers and GaAs barrier layers are grown over the lower cavity spacer layer 120 (FIG. 1B) as will be described below with respect to FIG. 2B. In this example, the substrate is GaAs to ensure lattice matched epitaxial growth of the GaAs lower and upper cavity spacer layers 120, 140, and the DBRs 110 and 150. Alternatively, for an edge-emitting laser, the GaAs substrate ensures a lattice match for AlGaAs cladding layers.

The InGaAsN material that forms the quantum well layers has a bulk lattice constant that is larger than the bulk lattice constant of the GaAs lower cavity spacer layer 120. Therefore the lattice mismatch that occurs between the InGaAsN material and the GaAs material subjects the InGaAsN layers to a compressive strain, referred to as biaxial compression.

In accordance with the operation of an OMVPE reactor 210, the vaporous precursors travel into the OMVPE reactor, as indicated using arrow 216, and eventually pass over the heated substrate 220. As the vaporous precursors pass over the heated substrate 220, they are decomposed by pyrolysis and/or surface reactions, thereby releasing the constituent species on the substrate surface. These species settle on the heated surface of the substrate 220, where they bond to the underlying crystal structure. In this manner, epitaxial growth occurs in the OMVPE reactor 210.

Figure 2B:
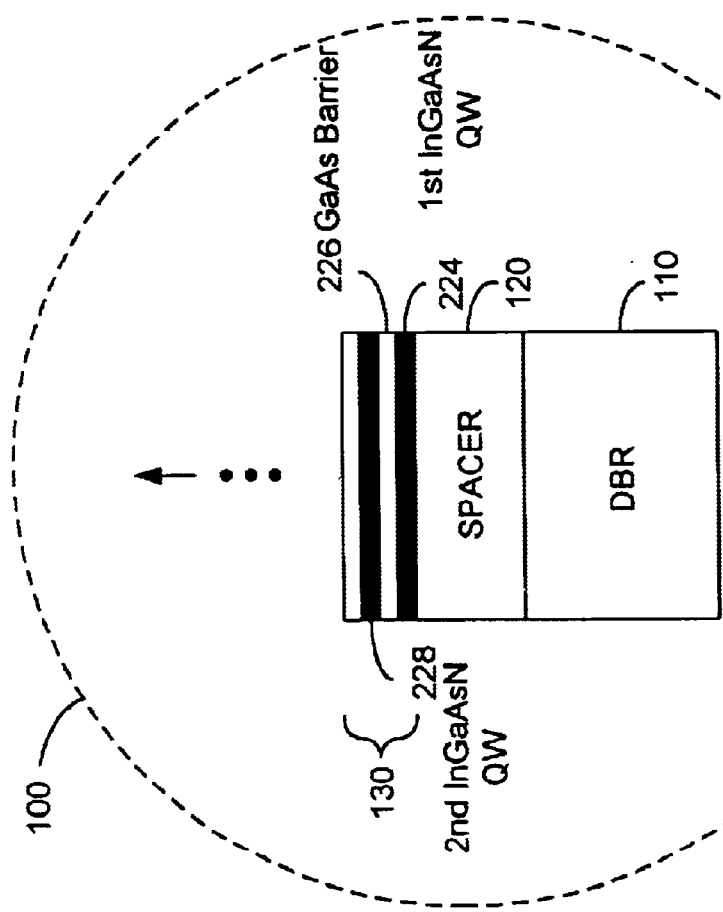
FIG. 2B is a detailed view of the VCSEL shown in FIG. 2A.

FIG. 2B is a detailed view of the VCSEL 100 shown in FIG. 2A partway through the fabrication process. The epitaxial layers that form the DBR 110, lower cavity spacer layer 120, active region 130, upper cavity spacer layer 140 and the DBR 150 are deposited using MOCVD. In accordance with an embodiment of the invention, and to ensure a sufficient quantity of nitrogen in the InGaAsN quantum well layers, the pressure in the OMVPE reactor 210 is elevated so that the arsine flow rate can be reduced. This results in a larger proportion of nitrogen being extracted from the dimethylhydrazine and deposited in the InGaAsN quantum well layers. Typical growth pressure in an OMVPE reactor ranges from 50 to 100 millibar (mbar). However, the pressure in the OMVPE reactor 210 can be increased to several hundred mbar, even approaching atmospheric pressure (1000 mbar).

Raising the pressure in the OMVPE reactor 210 permits continuous growth of InGaAsN while ensuring that a sufficient quantity of nitrogen is deposited on the epitaxial layer. Raising the pressure in the OMVPE reactor 210 reduces the amount of arsine ($AsH_3$) required to produce a high quality optical device. The reduced arsine requirement permits a relatively high dimethylhydrazine (DMHy) ratio, thereby reducing the likelihood that the arsenic will occupy the group-V lattice sites that are preferably left vacant for the nitrogen to occupy. In this manner, it is possible to produce an InGaAsN quantum well having superior optical properties, while still ensuring that a large fraction (as much as on the order of 2%) of nitrogen will be present in the InGaAsN material from which the quantum well layer is formed.

As shown in FIG. 2B, a first InGaAsN quantum well layer 224 is grown over the GaAs lower cavity spacer layer 120. Because the lower cavity spacer layer 120 is formed using GaAs, the lower cavity spacer layer 120 acts as a barrier layer for the first InGaAs quantum well layer 224. A GaAs barrier layer 226 is then grown over the first InGaAsN quantum well layer 224. This growth process is repeated until the desired number of quantum wells is grown.

To understand the role of increased growth pressure in growing InGaAsN, a description of the arsine partial pressure with respect to growing GaAs will first be provided. At higher growth pressures the quantity of arsine required to fabricate a device of high optical quality is reduced when using OMVPE to fabricate an InGaAsN quantum well layer. For example, it is possible to grow GaAs of excellent optical and optoelectronic quality (i.e., high internal quantum efficiency of radiative recombination) with a lower arsine flow rate if the growth is performed at a higher total pressure. Total pressure is the sum of the partial pressures of the vaporous precursors and is the pressure that is maintained in the reactor 210. The arsine partial pressure is a growth parameter that is frequently expressed as the V:III ratio, which is directly proportional to the arsine partial pressure for GaAs. This analysis can easily be extended to quaternary compounds such as InGaAsN, as will be described below.

The poor optoelectronic quality of GaAs grown with an insufficient V:III ratio suggests that some minimum partial pressure of arsine is desirable to suppress the formation of defects that limit the light-emission efficiency of the device. These defects may be arsenic vacancies, which are more likely to form under arsenic-deficient conditions. Regarding the solid-state chemistry of defect formation, the group-V vacancy concentration tends to diminish as the concentration of active group-V precursor species in the vapor over the substrate wafer is raised. Thus, there is some threshold value for the arsine partial pressure for producing material of good optical quality. While this value depends somewhat on the growth conditions (rate, temperature, etc.) and reactor geometry, it is estimated that for growth of arsenides by OMVPE, an arsine partial pressure of at least 1 mbar provides material having excellent optoelectronic characteristics, which can be characterized by an internal quantum efficiency of radiative recombination approaching 100%.

Consequently, during growth of group-III-arsenides, as the total pressure is increased, the minimum partial pressure of arsine ($AsH_3$) may be obtained with a decreased arsine flow rate. For example, a typical single-wafer reactor may have a carrier flow rate of several liters per minute. If growth is conducted at a low pressure of 50 mbar, an arsine flow rate of about 50 standard cubic centimeters per minute (sccm) is preferable for growth of material having excellent optoelectronic characteristics. This flow rate establishes an arsine ($AsH_3$) partial pressure estimated to be ~1 mbar. However, if the growth is instead performed at a high pressure of 200 mbar, the arsine partial pressure requirement can be satisfied by a flow rate decreased to only about 10 sccm. This lower arsine flow rate during OMVPE growth at higher pressures applies to other reactor geometries as well. For example, in a simple, single-wafer vertical reactor, an arsine flow rate of only approximately 20 sccm is desired for growth at atmospheric pressure, while 100 sccm is desired at 100 mbar (both corresponding to an arsine partial pressure of about 1–2 mbar).

Generally, the above-described advantage of high-pressure growth is obtained at the expense of more difficult interface formation that occurs at elevated pressures. However, in the context of InGaAsN growth, higher pressure is especially advantageous because it can be employed to minimize the arsine flow rate and maximize nitrogen incorporation.

A primary challenge in InGaAsN growth is realizing a very high vapor concentration of the exemplary nitrogen precursor dimethylhydrazine, while still preserving an arsine partial pressure that is sufficient for growth of material having an internal quantum efficiency of radiative recombination approaching 100%. Although the $[N]_{vapor}$ composition can conventionally be increased by reducing the arsine flow rate, this may also produce material having poor optoelectronic characteristics. However, by growing at a higher total pressure, the arsine flow rate may be reduced, while maintaining the same arsine partial pressure. The resulting mixture is highly nitrogen-rich for enhancing the nitrogen content of InGaAsN alloys, and forming a material having excellent optoelectronic characteristics.

The advantage for a lower arsine ($AsH_3$) flow rate is especially clear when it is considered that the dimethylhydrazine flow rate is limited because it is a liquid source, the vapor of which is transported into the reactor using a carrier gas, such as hydrogen. Generally, for a liquid source, the bubbler's carrier gas flow should not exceed 500 sccm. Otherwise, the carrier gas may no longer be saturated with the precursor vapor. In addition, the bubbler temperature should be held lower than room temperature to avoid condensation in the gas lines between the bubbler and reactor. These considerations dictate that the maximum DMHy flow rate should be limited to:

$$f_{DMHy}^{maximum} \cong 500 \text{ sccm} \cdot \frac{163 \text{ mbar}}{400 \text{ mbar} - 163 \text{ mbar}} \approx 350 \text{ sccm}$$

This assumes a bubbler temperature of 20° C. (for which the DMHy vapor pressure is 163 mbar), and a total bubbler pressure of 400 mbar (~300 Torr).

The nitrogen content of the InGaAsN film will increase as the nitrogen content of the vapor increases. Thus, to achieve the maximum $[N]_{vapor}$, the maximum DMHy bubbler flow rate should be used, along with an arsine flow rate no higher than that, which satisfies the arsine partial pressure requirement. Computing the vapor concentration of dimethylhydrazine $[N]_{vapor} = f_{DMHy}/\{f_{DMHy} + f_{AsH3}\}$ (where $f_{DMHy}$ and $f_{AsH3}$ are the dimethylhydrazine and arsine flow rates, respectively), from the numerical examples above gives, for the two different growth pressures of 50 mbar (minimum $AsH_3$=50 sccm) and 200 mbar (minimum $AsH_3$=10 sccm), $$[N]_{vapor}^{50-mbar} \cong \frac{350 \text{ sccm}}{350 \text{ sccm} + 50 \text{ sccm}} \approx 0.875$$

$$[N]_{vapor}^{200-mbar} \cong \frac{350 \text{ sccm}}{350 \text{ sccm} + 10 \text{ sccm}} \approx 0.972$$

Thus, this example indicates that raised growth pressure can enable a significantly higher nitrogen concentration in the vapor, while simultaneously maintaining sufficient arsine supply for epitaxial growth of material with excellent optoelectronic quality.

Figure 3:
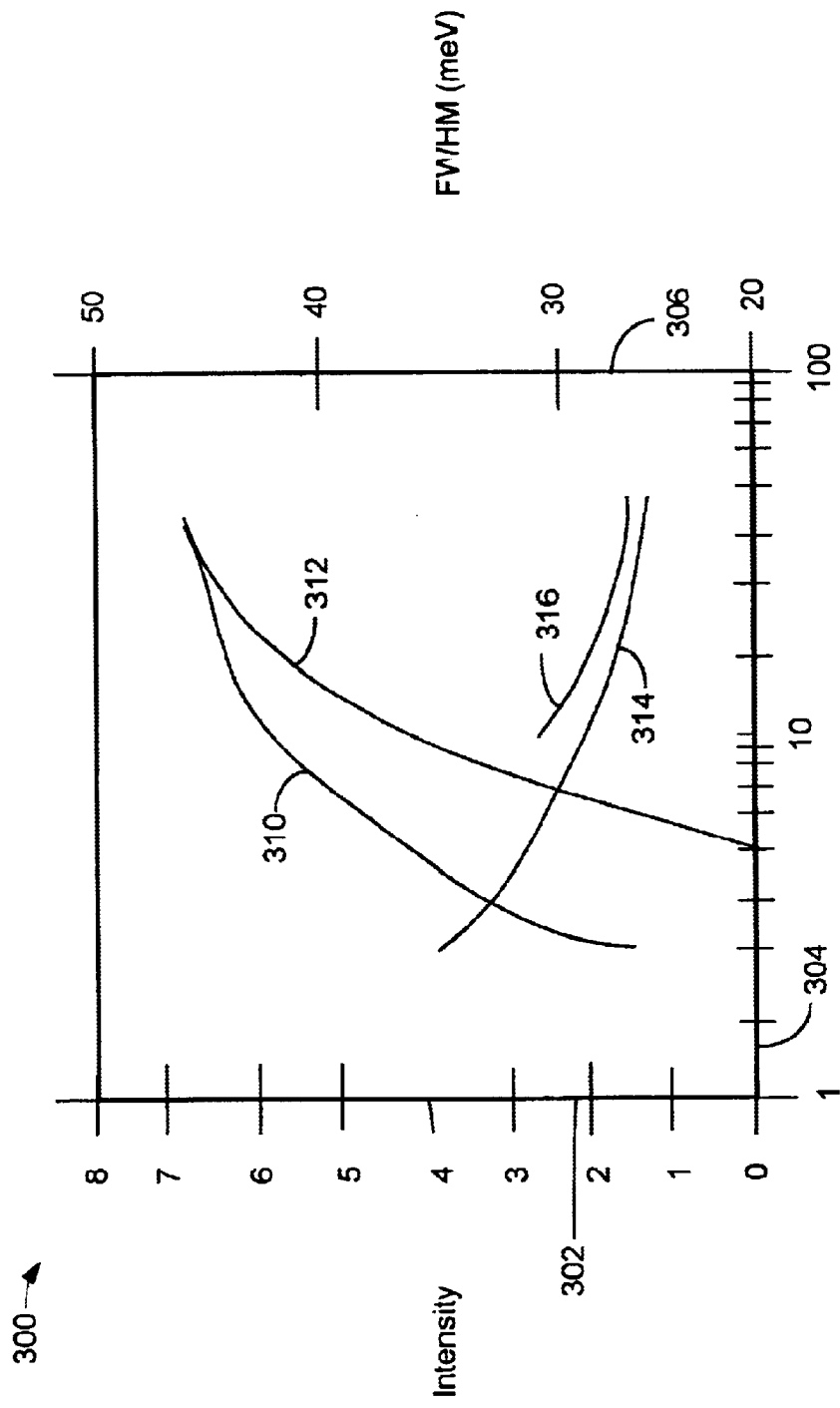
FIG. 3 is a graphical illustration showing a comparison of the photoluminescence for two InGaAs quantum wells, one fabricated at a reactor pressure of 100 mbar and the other fabricated at a reactor pressure of 200 mbar.

FIG. 3 is a graphical illustration 300 showing a comparison of the photoluminescence for two InGaAs quantum wells, one fabricated at an increased growth pressure of 100 mbar and the other fabricated at an increased growth pressure of 200 mbar. In this example, InGaAs quantum wells are used to illustrate the minimum amount of arsine used to grow an InGaAs quantum well having high optical quality. Essentially, FIG. 3 illustrates the effect that increasing the total growth pressure and lowering the arsine flow rate has on light intensity.

In FIG. 3, the left-hand vertical axis 302 represents light intensity, the right-hand vertical axis 306 represents the full width at half maximum (FWHM) spectral peak in millielectron volts (meV), and the horizontal axis 304 represents the arsine ($AsH_3$) to group-III material ratio. This ratio represents the absolute ratio of arsine ($AsH_3$) to group-III materials. For example, an arsine ($AsH_3$) to group-III ratio of 10 indicates that atomically there are 10 times more arsine ($AsH_3$) molecules than group-III precursor molecules. This ratio is also the arsine to group III atomic ratio because each arsine molecule contains one arsenic atom and the TMGa and TMIn molecules each contribute one group III atom. In an InGaAs quantum well, the indium and gallium are considered the group-III materials, while arsenic is the group-V material.

As shown using curves 310 and 312, the intensity of the phosphorescence of the InGaAs quantum well represented by curve 310 (where the InGaAs quantum well was formed at a reactor pressure of 200 mbar) exceeds the intensity of the phosphorescence of the InGaAs quantum well represented by curve 312, which was grown at a 100 mbar growth pressure, for arsine ($AsH_3$) to group III ratios in the approximate range of 2–80. Further, the arsine to group-III ratio indicates a lower arsine quantity for a given intensity and FWHM value for the InGaAs quantum well fabricated at the elevated 200 mbar growth pressure.

Similarly, the width of the spectral peak of the InGaAs quantum well formed at a growth pressure of 200 mbar (indicated by line 314) is narrower than the width of the spectral peak of the InGaAs quantum well formed at a growth pressure of 100 mbar, referred to using reference numeral 316. From the graph 300 it is clear that a high quality InGaAs quantum well can be grown with a lower arsine to group-III ratio, and therefore, at a lower arsine flow rate, by raising the reactor pressure from 100 mbar to 200 mbar.

Figure 4:
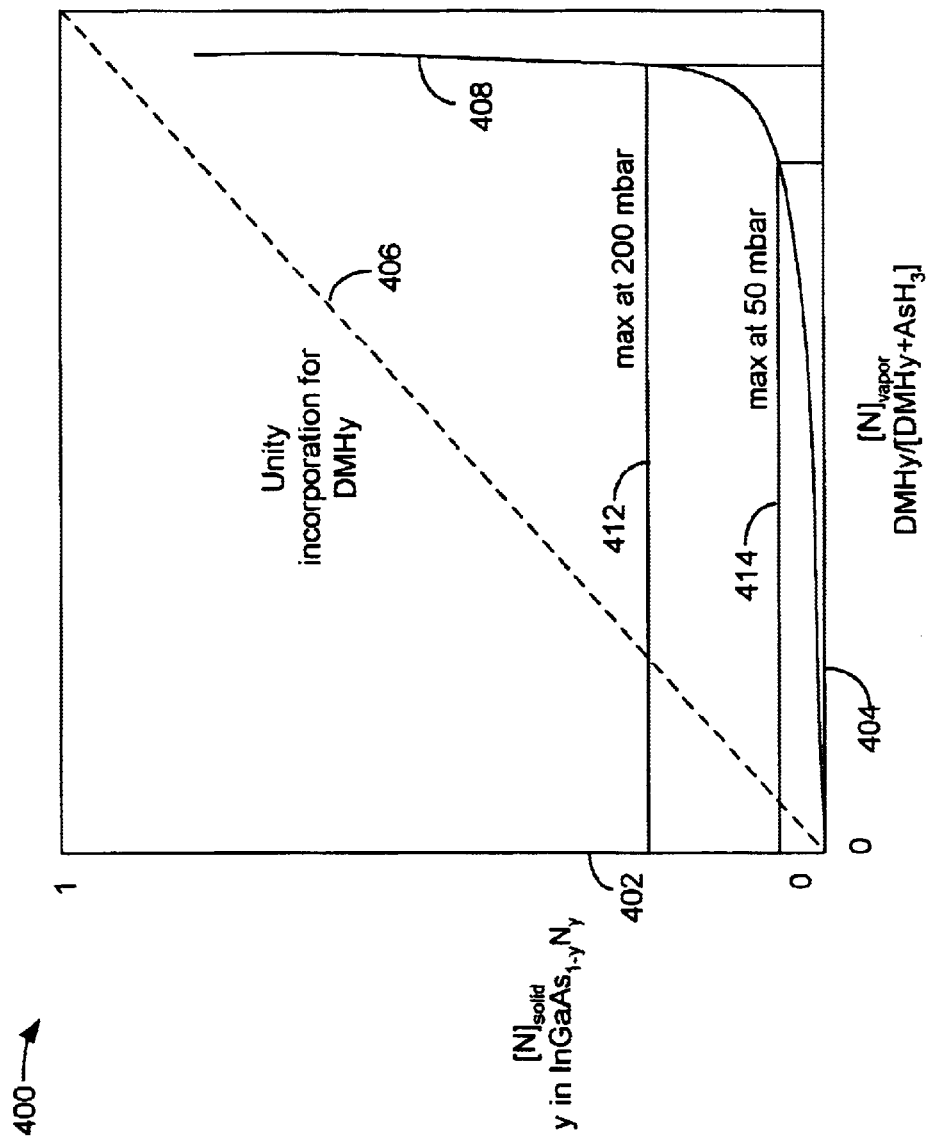
FIG. 4 is a graphical illustration showing the relationship between the concentration of nitrogen (N) in a solid film epitaxial layer (y in $InGaAs_{1-y}N_y$) and the concentration of nitrogen precursor in the vapor (DMHy/[DMHy+AsH$_3$]).

FIG. 4 is a graphical illustration 400 showing the relationship between the concentration of nitrogen (N) in an epitaxial layer (y in $InGaAs_{1-y}N_y$) and the concentration of nitrogen precursor in the vapor ($DMHy/[DMHy+AsH_3]$). In the graph 400, the vertical axis 402 represents the fraction of nitrogen in an epitaxial layer of InGaAsN, while the horizontal axis 404 represents the concentration of nitrogen precursor in the vapor $DMHy/[DMHy+AsH_3]$ (the total group-V precursor including the arsine and the DMHy). The dotted diagonal line 406 represents a nitrogen incorporation of unity in the epitaxial layer for dimethylhydrazine. As shown from the curve 408, it is clear that the amount of nitrogen in the solid epitaxial film (the vertical axis 402) at a growth pressure of 200 mbar, far exceeds the amount of nitrogen in the solid film at a growth pressure of 50 mbar. Essentially a higher growth pressure permits a higher $[N]_{solid}$ because the arsine content ($AsH_3$), as a proportion of the total group-V material, may be reduced so that the InGaAsN film may be grown in a more nitrogen-rich environment.

Figure 5F:
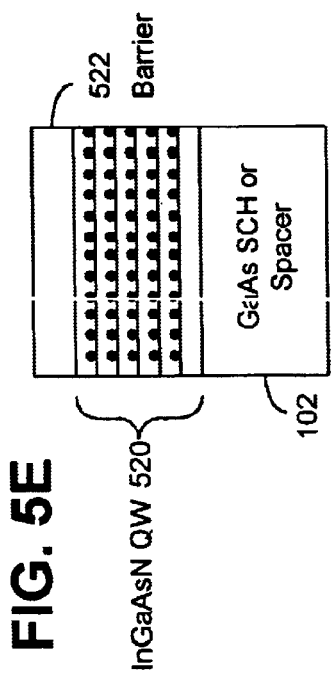
FIGS. 5A through 5F are schematic views illustrating an alternative embodiment of the invention.
Figure 5D:
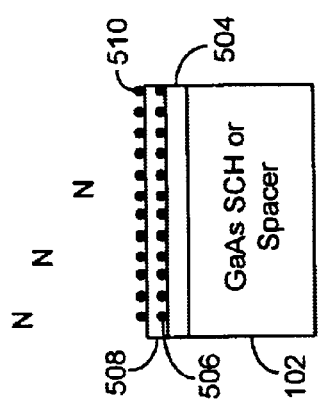
Figure 5E:
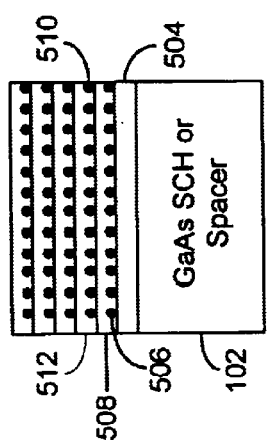
Figure 5A:
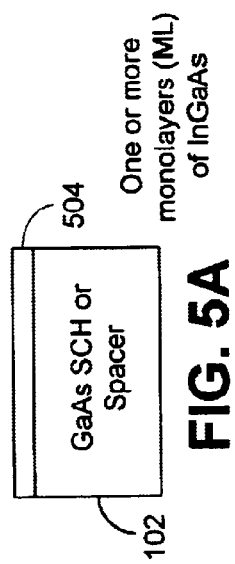

FIGS. 5A through 5F are schematic views illustrating an alternative embodiment of the invention. In FIG. 5A one or more sublayers of InGaAs 504 are formed over a GaAs region, which has the same characteristics as the GaAs lower cavity spacer layer 120 described above. The sublayers each have a thickness of one or two atoms.

Figure 5B:
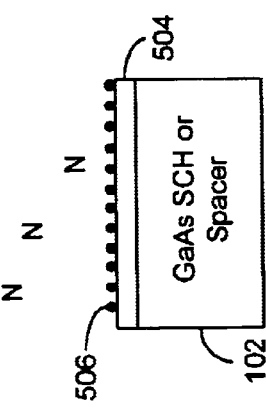

In FIG. 5B, the growth of the InGaAs sublayer 504 is stopped. This is referred to as a "growth stop" where the flow of the group-III precursors is discontinued. Additionally, the arsine flow rate is lowered and a high DMHy flow rate is switched into the reactor. This exposes the surface of the sublayer 504 to an ambient atmosphere with a very high nitrogen vapor content. The nitrogen atoms, an exemplary one of which is indicated using reference numeral 506, bond to and are incorporated in the sublayer 504.

Figure 5C:
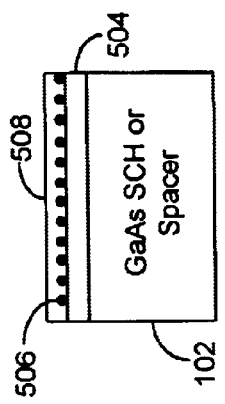

In FIG. 5C, the flow of the DMHy is discontinued, the flow of the group-III precursors is restored and the arsine flow is restored to its original level. Accordingly, the growth of the InGaAs is resumed and an additional sublayer 508 comprising InGaAs is grown over the nitrogen atoms 506. In FIG. 5D, another growth stop is performed, and the surface of the sublayer 508 is exposed to an ambient atmosphere having a very high nitrogen vapor content. As mentioned above with respect to FIG. 5B, nitrogen atoms 510 bond to the surface of the sublayer 508. A typical quantum well layer has a thickness of eight (8) nm, which, for InGaAsN are 15 sublayers. Accordingly, it is desirable to perform at least a few complete growth stop/nitrogen dose cycles for each quantum well layer. Preferably, each InGaAsN quantum well layer comprises eight (8) growth stop/nitrogen dose cycles, although more or fewer growth stop/nitrogen dose cycles are possible.

In FIG. 5E, alternating growth of InGaAs sublayers and nitrogen dosing steps is continued until a full thickness quantum well layer 520 of InGaAsN is grown. Finally, in FIG. 5H, a barrier layer 522 of, for example, GaAs, is grown over the InGaAsN quantum well layer 520. In this manner, InGaAsN having higher average nitrogen content may be achieved.

FIGS. 5A through 5F demonstrate that a high nitrogen content may be incorporated into an InGaAsN epitaxial film at an interface during a growth stop with a dimethylhydrazine+arsine mixture flowing into the reactor. In this case, analysis indicates a very high nitrogen content at the first QW interface (nitrogen atoms 506), when a 5-sec growth stop is incorporated to establish $AsH_3$ and DMHy flows into the reactor. In this manner, it is possible to enhance the nitrogen content of an InGaAsN quantum well layer by frequently stopping the InGaAs growth and dosing the surface with a $DMHy/AsH_3$ flux having a high DMHy to arsine ratio.

In another alternative embodiment, because nitrogen incorporates more favorably on a GaAs surface than on an InGaAs surface, it is possible to "passivate" an InGaAs sublayer by growing one monolayer of GaAs by discontinuing the indium precursor during growth of the monolayer. Such a monolayer could be formed by using a composition of $In_xGaAs_{1-x}$, where x is equal to 0. The resultant GaAs surface is then exposed to a mixture of DMHy and $AsH_3$ that is rich in DMHy to enhance the nitrogen content in the InGaAsN.

During a growth stop, there is a dynamic equilibrium between absorption and desorption of arsenic from the crystal surface of the InGaAs sublayer. However, to stabilize the surface against decomposition, the arsine flow rate should be somewhat less than the flow rate required to support growth of high-quality material. Consequently, during each growth stop, the arsine flow rate may be reduced, thereby increasing the relative DMHy content of the vapor mixture to further encourage greater nitrogen incorporation.

It will be apparent to those skilled in the art that many modifications and variations may be made to the preferred embodiments of the present invention, as set forth above, without departing substantially from the principles of the present invention. For example, many light emitting devices can benefit from the economical growth of an InGaAsN active layer. The InGaAsN active region, including InGaAsN quantum well layers can be used in surface-emitting as well as edge-emitting lasers. All such modifications and variations are intended to be included herein within the scope of the present invention, as defined in the claims that follow.

What is claimed is:

1. A method for producing an active region for a long wavelength light emitting device, the method comprising the steps of:

placing a substrate in an organometallic vapor phase epitaxy (OMVPE) reactor, the substrate for supporting growth of an indium gallium arsenide nitride (InGaAsN) film;

supplying to the reactor a group-III–V precursor mixture comprising arsine, dimethylhydrazine, alkyl-gallium, alkyl-indium and a carrier gas, where the arsine and the dimethylhydrazine are the group-V precursor materials and where the percentage of dimethylhydrazine substantially exceeds the percentage of arsine; and pressurizing the reactor to a pressure at which a concentration of nitrogen commensurate with light emission at a wavelength longer than 1.2 um is extracted from the dimethylhydrazine and deposited on the substrate.

2. The method of claim 1, wherein the pressure in the OMVPE reactor is at least 100 millibar (mbar).

3. The method of claim 1, wherein the pressure in the OMVPE reactor is at least 200 millibar (mbar).

4. The method of claim 1, further comprising adjusting the flow rate of the arsine to achieve an InGaAsN material having an internal quantum efficiency of radiative recombination approaching 100%.

5. The method of claim 4, wherein an arsine partial pressure is approximately 1 torr.

6. A method for producing an active region for a long wavelength light emitting device, the method comprising the steps of:

placing a substrate in an organometallic vapor phase epitaxy (OMVPE) reactor, the substrate for supporting growth of an indium gallium arsenide nitride (InGaAsN) film;

supplying to the reactor a group-III–V precursor mixture comprising arsine, alkyl-gallium, alkyl-indium and a carrier gas, where the arsine is the group-V precursor material;

growing a sublayer of $In_xGaAs_{1-x}$, where x is equal to or greater than 0;

discontinuing the group-III precursor mixture; and supplying to the reactor a group-V precursor mixture comprising arsine and dimethylhydrazine where the percentage of dimethylhydrazine substantially exceeds the percentage of arsine.

7. A method for producing an active region for a long wavelength light emitting device, comprising:

providing a substrate in an organometallic vapor phase epitaxy (OMVPE) reactor;

supplying to the reactor a group-III–V precursor mixture comprising arsine, dimethylhydrazine, alkyl-gallium, alkyl-indium and a carrier gas, where the arsine and the dimethylhydrazine are the group-V precursor materials and where the percentage of dimethylhydrazine substantially exceeds the percentage of arsine; and pressurizing the reactor to at least 100 millibar (mbar) to grow an indium gallium arsenide nitride layer.

8. The method of claim 7, wherein the substrate is gallium arsenide (GaAs).

9. The method of claim 8, wherein the reactor pressure ensures that a concentration of nitrogen commensurate with light emission at a wavelength longer than 1.2 um is extracted from the dimethylhydrazine and deposited on the substrate.

10. A method for producing an active region for a long wavelength light emitting device, comprising:

providing a substrate in an organometallic vapor phase epitaxy (OMVPE) reactor;

supplying to the reactor a group-III–V precursor mixture, where the group-III precursor mixture includes alkyl-gallium and alkyl-indium, and the group-V precursor mixture comprises arsine and dimethylhydrazine; and growing a layer of indium gallium arsenide nitride commensurate with light emission at a wavelength longer than 1.2 um over the substrate by minimizing the amount of arsine and maximizing the amount of dimethylhydrazine.

11. The method of claim 10, wherein the amount of arsine is minimized by pressurizing the reactor to at least 100 millibar (mbar).

12. The method of claim 10, wherein the amount of arsine is minimized by ceasing the flow of the alkyl-gallium and the alkyl-indium while the dimethyl-hydrazine is introduced into the reactor.

* * * * *